(12) United States Patent
Cusinato et al.

(10) Patent No.: US 6,621,435 B2
(45) Date of Patent: *Sep. 16, 2003

(54) METHOD AND CIRCUIT FOR IMPROVING THE SIGNAL/NOISE RATIO OF A SIGMA-DELTA MODULATOR

(75) Inventors: Paolo Cusinato, Sestri Levante (IT); Andrea Baschirotto, Tortona (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 10/001,907

(22) Filed: Oct. 24, 2001

(65) Prior Publication Data

US 2002/0084924 A1 Jul. 4, 2002

(30) Foreign Application Priority Data

Oct. 25, 2000  (EP) .............................. 00830700

(51) Int. Cl.[7] ................................ H03M 3/00
(52) U.S. Cl. ..................... 341/143; 341/144; 341/155
(58) Field of Search ............... 341/143, 144, 341/155, 120, 118; 327/337

(56) References Cited

U.S. PATENT DOCUMENTS

| | | | | |
|---|---|---|---|---|
| 3,971,987 A | * | 7/1976 | Carrubba et al. | 341/143 |
| 5,012,244 A | * | 4/1991 | Wellard et al. | 341/120 |
| 5,162,799 A | * | 11/1992 | Tanimoto | 341/143 |
| 5,248,972 A | * | 9/1993 | Karema et al. | 341/143 |
| 5,283,578 A | * | 2/1994 | Ribner et al. | 341/118 |
| 5,757,301 A | * | 5/1998 | Kuo et al. | 341/143 |
| 5,805,093 A | * | 9/1998 | Heikkila et al. | 341/118 |
| 6,020,836 A | | 2/2000 | Tlaskal | 341/143 |
| 6,061,009 A | * | 5/2000 | Krone et al. | 327/337 |
| 6,157,331 A | * | 12/2000 | Liu et al. | 341/118 |
| 6,396,428 B1 | * | 5/2002 | Cheng | 341/143 |
| 6,489,907 B2 | * | 12/2002 | Cusinato et al. | 341/143 |

FOREIGN PATENT DOCUMENTS

EP   0512687 A2   11/1992

OTHER PUBLICATIONS

US app. No. 09/919,509, Cusinato et al., Method or re-establishing the stability of a sigma-delta modulator and a circuit for implementing the method, filing date Jul. 30, 2001.*

* cited by examiner

Primary Examiner—Jean Bruner Jeanglaude
(74) Attorney, Agent, or Firm—Lisa K. Jorgenson; E. Russell Tarleton; SEED IP Law Group

(57) ABSTRACT

A method of improving the signal/noise ratio of a sigma-delta modulator during the re-establishment of its stability that includes: defining a bit sequence corresponding to a state of instability of the modulator, monitoring the flow of bits output by the modulator to check whether it contains the instability bit sequence, and resetting the modulator to zero if the instability bit sequence is detected at the output. To ensure a high signal/noise ratio of the modulator even during the detection and re-establishment of stability, the method also includes: delaying the flow of bits output by the modulator at least for the time required to detect the instability bit sequence and modifying the output bit sequence during the delay period by replacing it with a predetermined bit sequence.

16 Claims, 2 Drawing Sheets

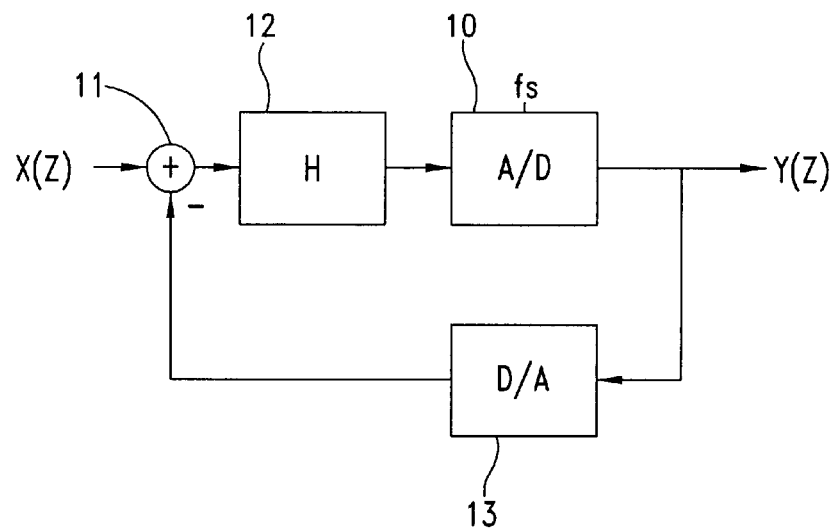
Fig. 1
*(Prior Art)*
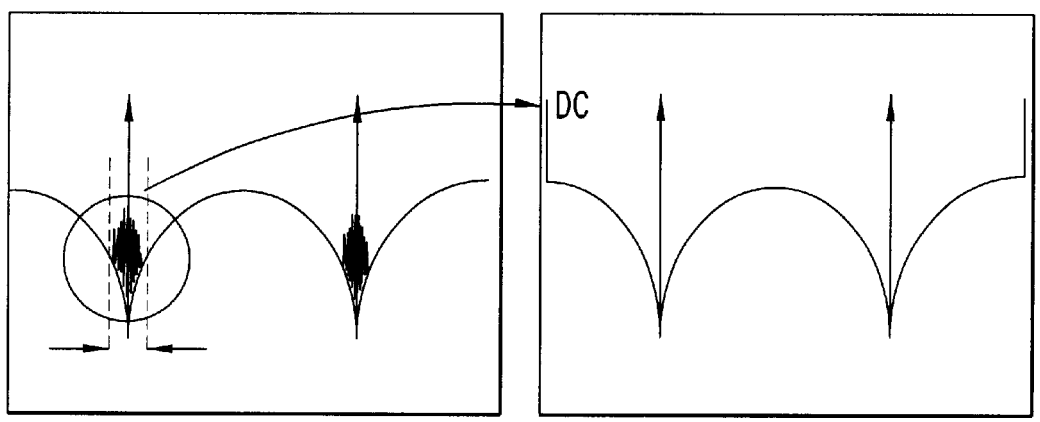
Fig. 3A  Fig. 3B

METHOD AND CIRCUIT FOR IMPROVING THE SIGNAL/NOISE RATIO OF A SIGMA-DELTA MODULATOR

BACKGROUND OF THE INVENTION

1. Field of the Invention

The present invention relates in general to sigma-delta modulators and, more particularly, to a method of improving the signal/noise ratio of a sigma-delta modulator during the re-establishment of its stability, and to a circuit that uses the method.

2. Description of the Related Art

As is known, sigma-delta modulation is a technique which enables a high-resolution analogue-digital conversion to be achieved. According to this technique, an analogue signal is "over-sampled," that is, it is sampled at a rate much faster than is necessary for a conventional analogue-digital converter operating at the Nyquist rate. A sigma-delta modulator integrates the analogue signal and performs a conventional delta modulation on the integral of the signal. For this purpose, the modulator uses a low-resolution quantizer. The output signal of the quantizer is added, with its sign reversed, to the analogue input signal, by a feedback loop containing a digital-analogue converter.

To produce a digital signal corresponding to the analogue input signal, the signal output by the modulator is subjected to the action of a so-called digital decimation filter which produces a digital output signal with a sampling rate equal to twice the Nyquist rate. By virtue of the over-sampling and of the digital decimation, this technique achieves a better resolution and less distortion than can be achieved with the technique of conversion at the Nyquist rate. Moreover, since the error signal, that is, the difference between the input signal and the sampled signal, is integrated, the sigma-delta modulator acts as a low-pass filter for the signal and as a high-pass filter for the quantization noise. It thus attenuates the noise in the signal band particularly effectively.

The noise attenuation is appreciable even with a first-order sigma-delta modulator, that is, a sigma-delta modulator comprising a single integrator upstream of the quantizer; however, to achieve the high signal-noise ratios required of high-resolution analogue-digital converters, it is necessary to use higher-order modulators, that is, modulators comprising several integrators in cascade.

With a higher-order modulator, however, problems of stability arise. The system may in fact be stable or unstable in dependence on the type of input signal (in particular, it is unstable for signals which exceed the input volume range of the circuit), in dependence on the starting conditions upon switching-on, and in dependence on the presence of any fluctuations in the supply voltage.

As soon as there is a departure from ideal operating conditions and, more precisely, when the gain of an element of the feedback loop falls below a certain limit, the modulator becomes unstable and tends to oscillate. The quantizer is an element of the feedback loop. The gain of the feedback loop is subject to variations as the operating conditions vary. Conditions of instability arise when the voltages of the internal analogue nodes reach values above the maximum design swing. In order to re-establish conditions of stability, intervention from outside the circuit is required. Various methods of doing this have been proposed and differ from one another in the manner in which the instability is detected and in the action undertaken to re-establish stability.

A first method provides for the connection of limiter elements in parallel with the capacitors of the integrators. The selection of the thresholds of the limiters is critical; in fact, if the thresholds are close to the limits of the dynamic range of the operational amplifiers of the integrators, the signal may also be limited during normal operation with high input signal levels, causing distortion; if, however, the thresholds are too low, there is a low signal/noise ratio. This solution cannot therefore be used in applications in which linearity is essential and a high signal/noise ratio is required.

A second method provides for detection of the oscillation which occurs in conditions of instability by measuring the analogue voltages of the internal nodes of the circuit and comparing them with respective predetermined reference values. If the reference values are exceeded, the system is considered unstable and the state variables of the modulator are reset to zero. In this case also, unnecessary limitations may occur since, in normal operation, some internal nodes may often be overloaded temporarily without this necessarily causing a condition of instability.

It has also been proposed to allow the modulator to become unstable and to detect the instability by monitoring the digital output signal. More particularly, a sequence of bits which corresponds to an instability state is defined and the output flow of bits is kept under surveillance in order to identify the appearance of such a sequence and consequently to indicate an instability state. As soon as the instability is detected, the output voltages of all of the integrators, or at least of some of them, are reset to zero so that, if the cause of the instability has ceased, the modulator is returned to stable operating conditions.

This technique has the advantage of avoiding unnecessary limitations during normal operation since the resetting operation is enabled only when an instability state has occurred. However, the time required to detect the instability is not always negligible so that, before the modulator is reset and returned to normal operating conditions, a residual output signal is present which degrades the signal/noise ratio in a manner which may be unacceptable in some applications. This phenomenon becomes very noticeable in the event of overloads which persist for long periods, causing repeated resetting operations.

BRIEF SUMMARY OF THE INVENTION

The disclosed embodiments of the present invention provide a method that ensures a sufficiently high signal/noise ratio of the sigma-delta modulator, even during detection and stability re-establishment operations. A circuit for implementing the method is also provided.

In accordance with a method of the present invention, the signal-to-noise ratio of a sigma-delta modulator is improved during the re-establishment of its stability by defining a bit sequence corresponding to a state of instability of the modulator; monitoring the flow of bits output by the modulator to check whether it contains the instability bit sequence; and resetting the modulator to zero if the instability bit sequence is detected at the output, including delaying the flow of bits output by the modulator at least for the time required to detect the instability bit sequence, and modifying the output bit sequence during the delay time by replacing it with a predetermined bit sequence.

In accordance with another embodiment of the invention, a circuit is provided that includes a sigma-delta modulator having an analog signal input which is also the output of the circuit, a digital signal output, and at least one zero-resetting input; and a control logic unit connected to the output of the modulator and to the zero-resetting input and comprising means for storing a sequence of output bits corresponding to a state of instability of the modulator, means for monitoring the flow of bits output by the modulator, and means for applying zero-setting signals to the zero-setting input of the modulator when the instability sequence is identified in the flow of bits output by the modulator, a shift register having a data input connected to the output of the modulator, a data output that is also the output of the circuit, and a setting input, the control logic unit including means for applying a setting signal to the setting input of the shift register when the instability sequence is identified in the flow of bits output by the modulator.

BRIEF DESCRIPTION OF THE SEVERAL VIEWS OF THE DRAWING(S)

The invention will be understood better from the following detailed description of a non-limiting embodiment, given with reference to the appended drawings, in which:

FIG. 1 is a block diagram of a conventional, first-order sigma-delta modulator,

FIGS. 3A and 3B show the output spectrum for a –20 dB input signal, measured at two nodes of the circuit with the sigma-delta modulator according to the invention.

DETAILED DESCRIPTION OF THE INVENTION

Figure 2:
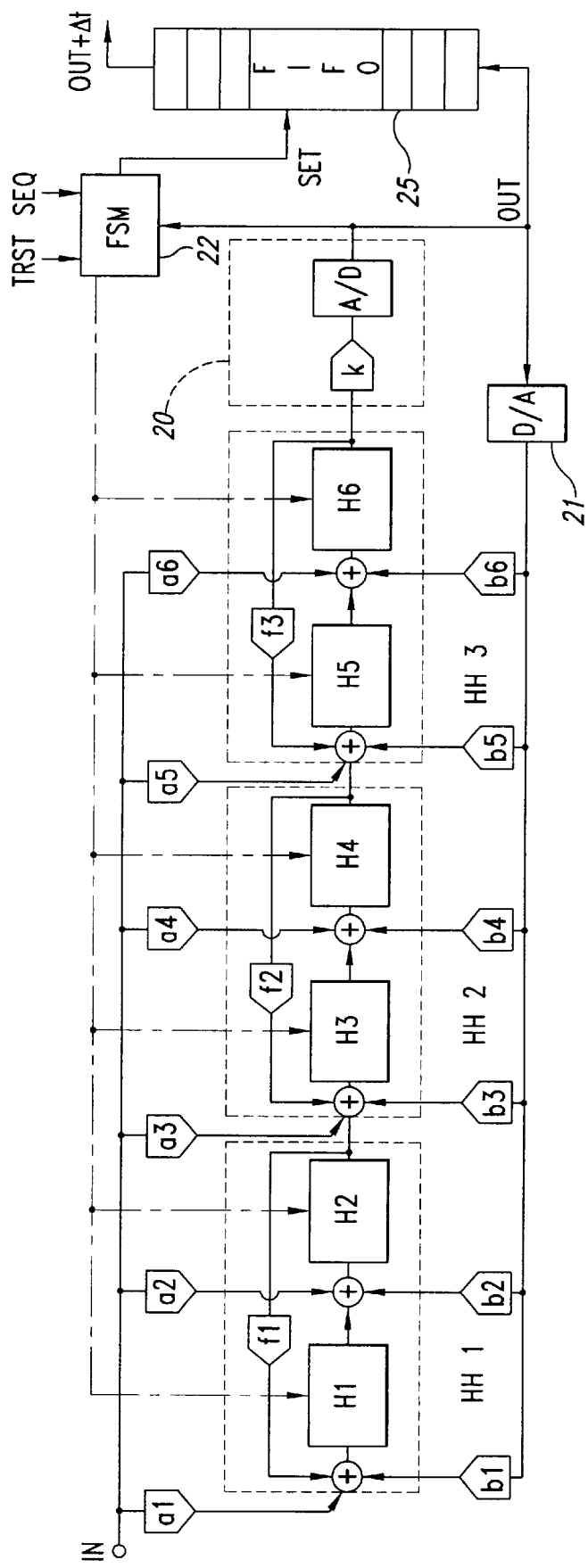
FIG. 2 is a block diagram of a circuit with a band-pass sigma-delta modulator according to the invention.

FIG. 1 shows a conventional sigma-delta modulator that includes an analogue-digital converter (A/D) or quantizer 10 and a feedback circuit constituted by an adder node 11, an integrator (H) 12, and a digital-analogue converter (D/A) 13. An analogue input signal X(z) is applied to the adder node 11. The output signal of the adder node is integrated by the integrator 12 and is then converted into digital form by the quantizer 10. The conversion takes place at a sampling frequency fs. The digital output Y(z) of the modulator is returned to analogue form by the digital-analogue converter 13 and is applied, with its sign reversed, to the adder node 11.

The adder node 11 thus supplies an error signal to the integrator 12. The effect of the feedback loop is such that the output Y(z) is a digital signal which oscillates about the value of the analogue input signal. The energy of this oscillating signal constitutes the quantization noise. The quantizer 10 and the digital-analogue converter 13 are typically single-bit converters and the quantization noise is therefore high. It can be shown that the transfer function Y(z)/X(z) of the signal is that of a low-pass filter the pass-band of which is determined by the characteristics of the integrator 12, and the transfer function of the noise is that of a high-pass filter the pass-band of which is determined by the sampling frequency fs. If the output of the modulator is connected to a decimation filter, the resulting circuit is an analogue-digital converter. With an appropriate selection of the cut-off frequency of the decimation filter, the input signal is not attenuated significantly, whereas the quantization noise is greatly attenuated.

As already mentioned, to achieve a considerable attenuation of the quantization noise, as is necessary to produce high-resolution analogue-digital converters, it is necessary to use modulators of an order higher than one.

The embodiment of the invention shown in FIG. 2 has a circuit with a sixth-order modulator, that is, a modulator comprising six integrators, indicated H1–H6, in cascade. The input terminal of each integrator is connected to the output terminal of the preceding integrator by means of an adder. An input signal is applied to the various adders with different weights determined by suitable connection means with scale factors a1–a6. The output terminal of the last integrator H6 is connected to the input terminal of a single-bit analogue-digital converter or quantizer 20 the output OUT of which is connected to the data input of a shift register 25, preferably formed as a FIFO (first-in, first-out) memory. The data output OUT+Δt of the register 25, which is also the output of the circuit, may be connected to a digital decimation filter, not shown. The output of the quantizer 20 is also connected to the various adders via a digital-analogue converter 21 which is also a single-bit converter, and via suitable connection means with scale factors b1–b6.

In this embodiment, the integrators are connected in pairs by suitable feedback means f1, f2 and f3 to form three resonators HH1, HH2, HH3. The modulator behaves as a band-pass filter the pass-band of which is centered on a frequency other than zero, determined by the feedback means f1, f2 and f3. The scale factors and the feedback means are selected so as to achieve the desired transfer functions of the signal and of the noise. A control logic and stabilization unit 22 is connected to the output terminal OUT of the modulator, to a setting input, indicated SET, of the register 25, and to the integrators, by means of respective zero-resetting terminals. The unit is preferably constituted by a so-called finite states machine (FSM) and is programmed so as to monitor the flow of bits output by the quantizer 20 to check whether a predetermined bit sequence SEQ corresponding to a condition of instability of the modulator appears therein. This sequence can be defined experimentally by bringing about a state of instability of the modulator and observing the output flow of bits. The sequence SEQ is entered and stored in the logic unit 22. The unit 22 is also programmed to send a zero-resetting signal to the last integrator H6 as soon as the instability sequence is identified in the output signal. The duration of the zero-resetting signal TRST, which is also entered and stored in the unit 22, is selected so as to be long enough to ensure effective resetting of the integrator, that is, in practice, to discharge the capacitors of the integrator completely.

The resetting of the last integrator is normally sufficient to re-establish the stability of the modulator. In fact, an instability situation is caused by an overload at the node between the last integrator and the quantizer so that the gain of the quantizer, indicated k in FIG. 2, is too low and the feedback of the system becomes positive; when the last integrator is reset to zero, the gain of the quantizer increases and the feedback tends to become negative again, restoring the stability of the system. In other words, after the last integrator has been reset to zero and before it is reactivated, the modulator behaves as a modulator of an order lower by one and therefore tends to be more stable.

It is important to point out that the noise caused by the resetting operation is processed in accordance with the transfer functions of the preceding integrators H1 to H5 and that the time required for the modulator to start to operate again is very short since it is due to the recovery time of the last integrator H6 alone.

If, after this operation, the unit 22 again identifies the instability sequence in the output flow of bits, a zero-resetting signal is applied both to the integrator H6 and to the preceding integrator H5. If the instability is still not eliminated, the above-described operations are repeated, the number of stages reset being increased by one each time.

During normal operation of the modulator, the likelihood of finding an instability condition which requires intervention on all of the integrator stages is very low so that, in most cases, the noise of the resetting operation is processed by at least one integrator and the time taken to re-establish the operation of the modulator is always less than that which would be required if all of the integrators were reset simultaneously.

During normal operation, the register 25 has the sole effect of transferring the flow of data output by the quantizer 20 to the output OUT+$\Delta$t of the circuit with a predetermined delay $\Delta$t.

If, however, an instability bit sequence is detected in the flow of data output by the quantizer 20, the logic circuit 22 applies to the setting input of the register 25 a signal which modifies the bit sequence contained in the register, replacing it with a predetermined bit sequence. In this example, the predetermined bit sequence is a series of zeroes; this corresponds to shifting the energy of the output signal associated with the instability from frequencies within the pass-band of the modulator to a region around the frequency 0, as shown in FIGS. 3A and 3B for an output spectrum measured for a −20 dB input signal. FIG. 3A shows the effect of an operation to reset the modulator at the output OUT of the quantizer 20 as a result of a voltage peak; the energy contribution caused by the instability is within the pass-band. FIG. 3B shows the same spectrum measured at the output OUT+$\Delta$t of the register 25; the energy contribution caused by the instability has been shifted out of the pass-band and, more precisely, to the frequency 0, and can easily be eliminated by suitable digital filters downstream of the modulator. Clearly, the signal/noise ratio of the modulator is thus considerably improved.

Although only one embodiment of the invention has been described and illustrated, naturally many variations and modifications are possible within the scope of the same inventive concept. For example, the register 25 may be included in the FSM unit 22 and may also serve for the function of monitoring the output flow of bits; it may also be a register other than a FIFO memory, provided that it can temporarily store an adequate number of output bits, and provided that it has means for modifying its content when required. Moreover, the invention may also advantageously be implemented with a low-pass modulator or with a high-pass modulator rather than with a band-pass modulator as described.

What is claimed is:

1. A method of improving the signal/noise ratio of a sigma-delta modulator during the re-establishment of its stability, comprising the following steps:
   defining a bit sequence corresponding to a state of instability of the modulator,
   monitoring the flow of bits output by the modulator to check whether it contains the instability bit sequence, and
   resetting the modulator to zero if the instability bit sequence is detected at the output,
   delaying the flow of bits output by the modulator at least for the time required to detect the instability bit sequence, and
   modifying the output bit sequence during the delay time by replacing it with a predetermined bit sequence.

2. A circuit, comprising:
   a sigma-delta modulator having an analogue signal input which is also the input of the circuit, a digital signal output, and at least one zero-resetting input, and
   a control logic unit connected to the output of the modulator and to the zero-resetting input and comprising means for storing a sequence of output bits corresponding to a state of instability of the modulator, means for monitoring the flow of bits output by the modulator, and means for applying zero-resetting signals to the zero-resetting input of the modulator when the instability sequence is identified in the flow of bits output by the modulator,
   a shift register having a data input connected to the output of the modulator, a data output which is also the output of the circuit, and a setting input, the control logic unit comprising means for applying a setting signal to the setting input of the shift register when the instability sequence is identified in the flow of bits output by the modulator.

3. The circuit of claim 2 wherein the shift register forms part of the means included in the control logic unit for monitoring the output flow of bits.

4. The circuit of claim 2 wherein the shift register is a FIFO memory.

5. The circuit of claim 2 wherein the sigma-delta modulator is of an order greater than one and operates as a band-pass filter, and in which the setting signal is a signal that can modify a bit sequence contained in the register by replacing it with a predetermined bit sequence corresponding to a digital signal outside the pass-band of the modulator.

6. A modulator circuit, comprising:
   a sixth-order modulator having an analog input, a digital output, and at least one zero-resetting input, the modulator further comprising first, second, and third cascade-connected resonator circuits, each resonator circuit comprising first and second inputs and an output;
   an A/D converter circuit having an input coupled to an output of the sixth-order modulator, and an output;
   an output register having an input coupled to the output of the A/D converter circuit, a setting input, and an output;
   a D/A converter circuit coupled to the output of the modulator and having an output coupled to the first and second inputs of a first, second, and third resonator circuits; and
   a stabilization unit having an input coupled to the output of the A/D converter and a first output coupled to the output register, a second output coupled to the zero-resetting input, and configured to store a predetermined bit sequence corresponding to a state of instability of the modulator and to send a zero-resetting signal to the zero-resetting input and to send a re-setting signal to the setting input at the output register when the output of the A/D converter circuit comprises the predetermined bit sequence.

7. The modulator of claim 6 wherein the zero-resetting signal causes the output register to set all bits to zero.

8. The modulator of claim 6 wherein the stabilization unit is programmed to send a zero-resetting signal to the second input of the third resonator circuit upon a second detection of the predetermined bit sequence in the output of the A/D converter circuit.

9. The modulator of claim 8 wherein the zero-resetting signal initiates setting of all bits in the output register to a zero and all bits of the third resonator to zero.

10. The modulator of claim 9 wherein the zero-resetting signal has a duration that is long enough to discharge capacitors in the third resonator circuit.

11. The modulator of claim 8 wherein the stabilization unit is configured to send a zero-resetting signal to the output register, and to the first and second inputs of the third resonator circuit when the predetermined bit sequence is detected a third time.

12. A modulator circuit, comprising:

a sixth-order modulator having an analog input, a digital output, and at least one zero-resetting input, the modulator further comprising first, second, third, fourth, fifth, and sixth integrators cascade-connected together, each integrator comprising first and second inputs and an output;

an A/D converter circuit having an input coupled to an output of the sixth integrator, and an output;

an output register having an input coupled to the output of the A/D converter circuit, a setting input, and an output;

a D/A converter circuit coupled to the output of the sixth integrator circuit and having an output coupled to the first input of each integrator circuit; and a stabilization unit having an input coupled to the output of the A/D converter circuit, a first output coupled to the input of output register, a second output coupled to the zero-resetting input, the stabilization unit configured to store a predetermined bit sequence corresponding to a state of instability of the modulator and to send a zero-resetting signal to the zero-resetting input and to send a re-setting signal to the setting input when the stabilization unit detects the predetermined bit sequence on the output of the A/D converter circuit.

13. The modulator of claim 12 wherein the stabilization unit is programmed to send a zero-resetting signal to the input of the sixth integrator circuit.

14. The modulator of claim 13 wherein the stabilization unit is configured to send the zero-resetting signal for a period of sufficient length to discharge all capacitance in the sixth integrator circuit.

15. The modulator of claim 12 wherein the stabilization unit is programmed to send the zero-resetting signal to the output register upon a first occurrence of the predetermined bit sequence, to send the zero-setting signal to the output register and to the sixth integrator circuit upon a second occurrence of the predetermined bit sequence, and to send the zero-resetting signal each time the predetermined bit sequence is detected, with the number of integrator circuits receiving the zero-resetting signal increased by one upon each occurrence of the predetermined bit sequence.

16. A modulator circuit, comprising:

a sixth-order modulator comprising first, second, third, fourth, fifth, and sixth integrators cascade-connected together, each integrator comprising first and second inputs and an output;

an A/D converter circuit having an input coupled to an output of the sixth integrator, and an output;

an output register having an input coupled to the output of the A/D converter circuit, and an output;

a D/A converter circuit coupled to the output of the sixth integrator circuit and having an output coupled to the first input of each integrator circuit; and a stabilization unit having an input coupled to the output of the sixth integrator circuit, and an output coupled to the output register, the stabilization unit configured to send a zero-resetting signal when the stabilization unit detects a predetermined bit sequence on the output of the A/D converter circuit, to send a zero-resetting signal to the output register upon a first occurrence of the predetermined bit sequence, to send a zero-resetting signal to the output register and to the sixth integrator circuit upon a second occurrence of the predetermined bit sequence, and to send a zero-resetting signal each time the predetermined bit sequence is detected, with a number of integrator circuits receiving the zero-resetting signal increased by one upon each occurrence of the predetermined bit sequence, the stabilization unit further programmed to send the zero-resetting signal for a period of sufficient length to discharge all capacitance in the integrator circuit receiving the zero-resetting signal.

* * * * *